United States Patent [19]

Freeburn

[11] 4,453,503

[45] Jun. 12, 1984

[54] COOLING DEVICE

[76] Inventor: Edwin J. Freeburn, 20 Hornseywood Ave., Penrith, New South Wales, Australia, 2750

[21] Appl. No.: 376,854

[22] Filed: May 10, 1982

[51] Int. Cl.³ .............................. F01P 1/06; F01P 3/12; F25B 21/02
[52] U.S. Cl. ...................................... 123/41.31; 62/3
[58] Field of Search .................... 62/3; 123/41.31

[56] References Cited

U.S. PATENT DOCUMENTS

| 420,641 | 2/1890 | Dewey | 62/3 |
| 2,120,779 | 6/1938 | Ericson | 123/41.31 |
| 2,886,618 | 5/1959 | Goldsmid | 62/3 X |
| 2,910,836 | 11/1959 | Karrer | 62/3 |
| 3,008,300 | 11/1961 | Ryan et al. | 62/3 |
| 3,236,056 | 2/1966 | Phillips et al. | 62/3 |
| 3,255,593 | 6/1966 | Newton | 62/3 |
| 3,302,414 | 2/1967 | Sudmeier | 62/3 |
| 3,315,474 | 4/1967 | Farer | 62/3 |
| 3,386,255 | 6/1968 | Venema | 62/3 |
| 3,623,546 | 11/1971 | Banthin | 123/41.31 X |
| 3,874,183 | 4/1975 | Tabet | 62/3 |
| 4,155,337 | 5/1979 | Hensley | 123/41.31 X |

Primary Examiner—Lloyd L. King
Attorney, Agent, or Firm—Townsend and Townsend

[57] ABSTRACT

A heat transfer device using a thermal electric solid state heat pump coupled to a source of electrical energy to transfer heat between the heat pump and a pair of heat exchangers. One of the heat exchangers defines a fluid flow path for the transfer of heat between that heat exchanger and heat pump. The other heat exchanger transfers heat between the heat pump and the ambient environment. The direction of heat transfer is determined by the polarity of electricity supplied to the heat pump.

7 Claims, 4 Drawing Figures

COOLING DEVICE

BACKGROUND OF THE INVENTION

This invention relates to the cooling or heating of fluids and/or the condensation of vapours and gases. Hitherto, the supply of either hot or cold liquids or beverages usually required the installation of storage type refrigerated cabinets which by necessity of their design consume power not only to condition (i.e., cool or heat) a product, but also to maintain the desired temperature in the storage container or cabinet itself. Additionally, the majority of refrigeration systems employ the use of electric motor driven compressor condensing units incorporating high pressure refrigerants which are expensive to build, contain many moving parts, suffer from vibration, wear and tear, and are costly to repair.

Conventional heat pumps which employ mechanical refrigeration systems are very cost efficient particularly in the heating mode, but because they use mechanical pumps are relatively costly and space consuming when applied to small capacity applications.

SUMMARY OF THE INVENTION

With a device according to the present invention, energy is consumed only to change the temperature of the specific volume of the product to be dispensed. Further, both weight and volume are considerably less than comparable mechanical systems. There are no moving parts, hence no noise, vibration, wear from friction, no gas pressures, and because of the compact nature of the design both manufacture and installation costs are less.

For the sake of brevity the invention will be described with reference to the cooling of petrol or other liquid fuels for supply to internal combustion engine, but it is to be understood that the invention is not limited thereto as it may be applied, for example, to the cooling of industrial liquids including acids and to the condensing of vapours for reclamation and/or recycling purposes.

According to the invention there is provided a device for cooling or heating fluids and/or condensing vapours and gases, said device comprising:

(i) a thermo-electric solid state heat pump adapted to be connected to a source of electrical energy,
(ii) a first heat exchanger in operative association with the heat pump and having a flow path therein through which the fluid may be passed,
(iii) an inlet to and an outlet from the heat exchanger, and,
(iv) a second heat exchanger for dissipating the heat from or supply heat to the heat pump.

BRIEF DESCRIPTION OF THE DRAWING

In order that the invention may be readily understood and put into practical effect, reference will now be made to the accompanying drawings in which.

DETAILED DESCRIPTION OF THE PREFERRED EMBODIMENTS

Figure 1:
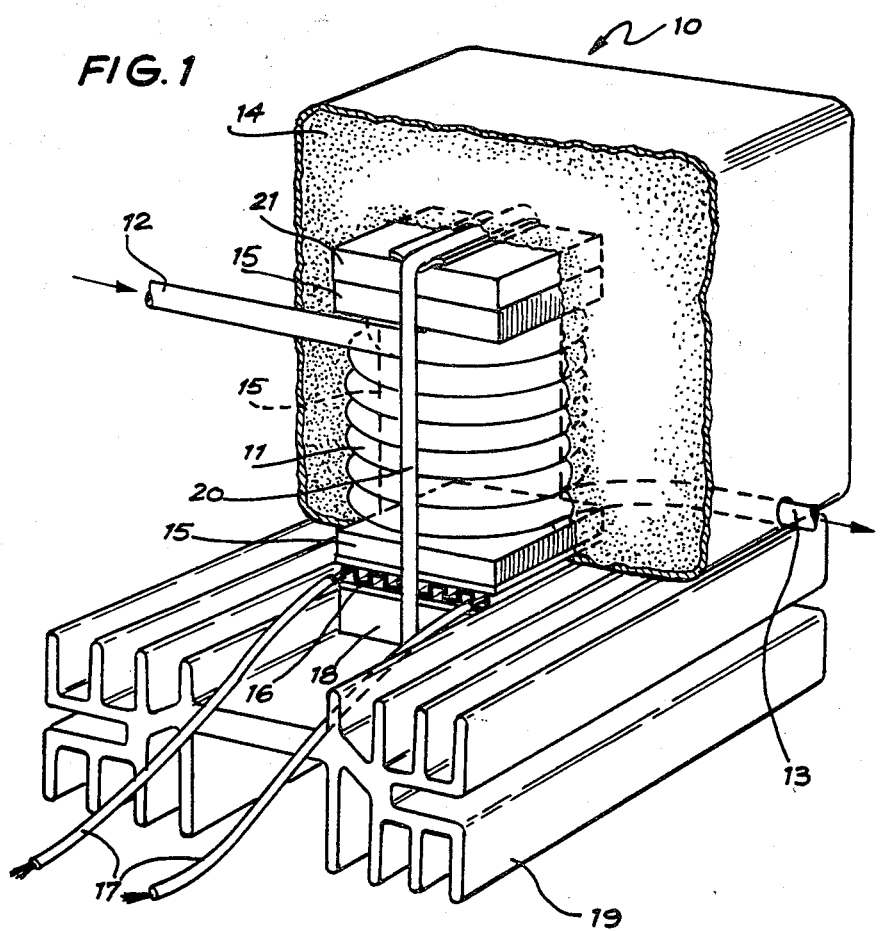
FIG. 1 is a partly cut away perspective view of a cooling device according to one embodiment of the invention.
Figure 2:
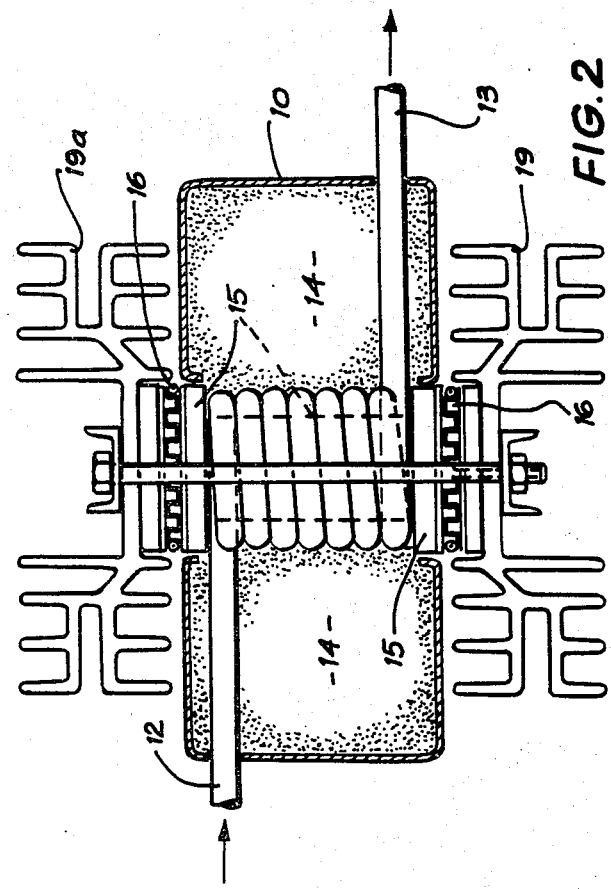
FIG. 2 is a cross-sectional view of a second embodiment of the invention.

The cooling device shown in FIGS. 1 and 2 has a housing 10 which encloses a coiled heat exchange plate 11 to which liquid to be cooled is admitted through inlet 12 and from which the cooled liquid is discharged through outlet 13. In this instance, the heat exchanger 11 consists of a copper tube spirally wound around the central portion of an aluminium heat transfer block 15. The heat exchanger 11 may, of course, be made of other materials in other ways to suit the application of the cooling device. For example, the heat exchanger could consist of a coil of tube die cast into a heat transfer block, the tube may be of copper, steel, aluminium or other suitable material. The heat exchanger 11 is insulated from the housing 10 by polyurethane foam 14.

The heat transfer block 15 is coupled in a heat transfer relationship to a heat pump 16 which is activated by a 12 volt D.C. supply applied to electrical connectors 17. The heat pump 16 is a thermo-electric solid state unit which operates on the Peltier Effect in that the electrical power is applied to the junction of two dissimilar metals to cause a flow of heat from one metal to the other.

One of the faces of the heat pump 16 is in a heat transfer relationship with the transfer block 15 and the other to a second heat transfer block 18 which is in a heat transfer relationship with the heat sink 19 having a ribbed finned surface which provides a substantial primary surface area for a small total volume of space. The heat exchanger/heat pump assembly is secured to the heat sink 19 by a "U" bolt clamp 20. An insulation block 21 is positioned between the clamp 20 and the heat transfer block 15.

In the embodiment shown in FIG. 2 the heat pump 16 has been duplicated, with one either end of heat transfer block 15, and there are two heat sinks 19 and 19a, one either side of housing 10. This embodiment increases the performance of the heat exchanger 11.

Figure 3:
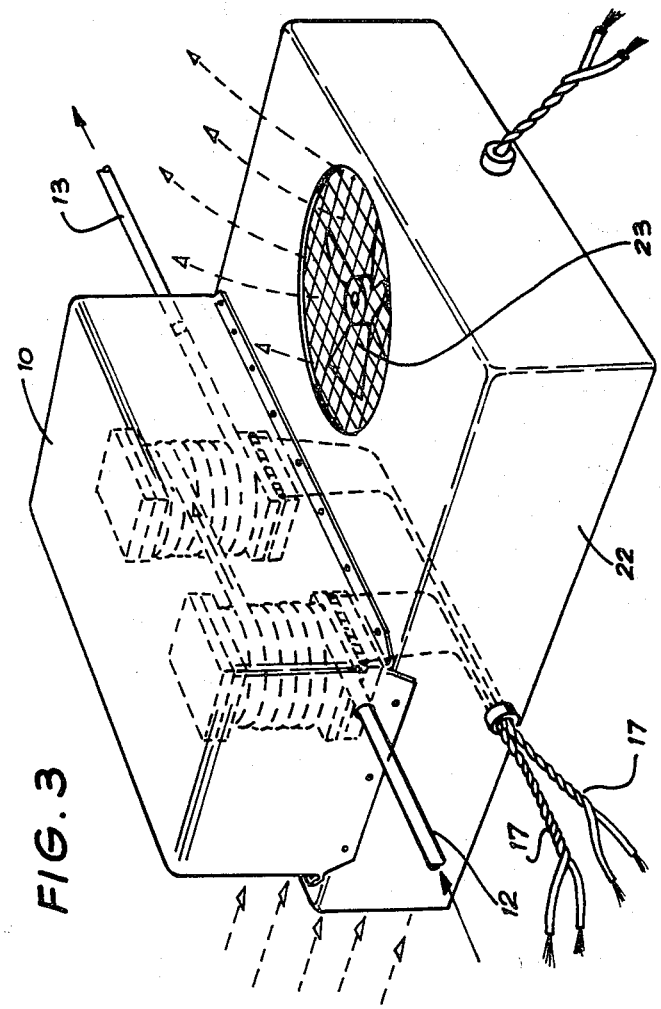
FIG. 3 is a perspective view of a second embodiment of the invention, and, FIG. 4 is a schematic diagram of the invention applied to the fuel supply system of a vehicle.

In the embodiment shown in FIG. 3 the heat sink 19 is encased in a cowling 22 whereby it may be connected to other means of forcing air over the heat sink such as the fan 23.

It is envisaged that limit thermostats shall also be incorporated on both the discharge pipe 13 and the heat sink 19, but these shall be of a design and temperature range to suit the individual applications to which the invention shall be adpated.

Figure 4:
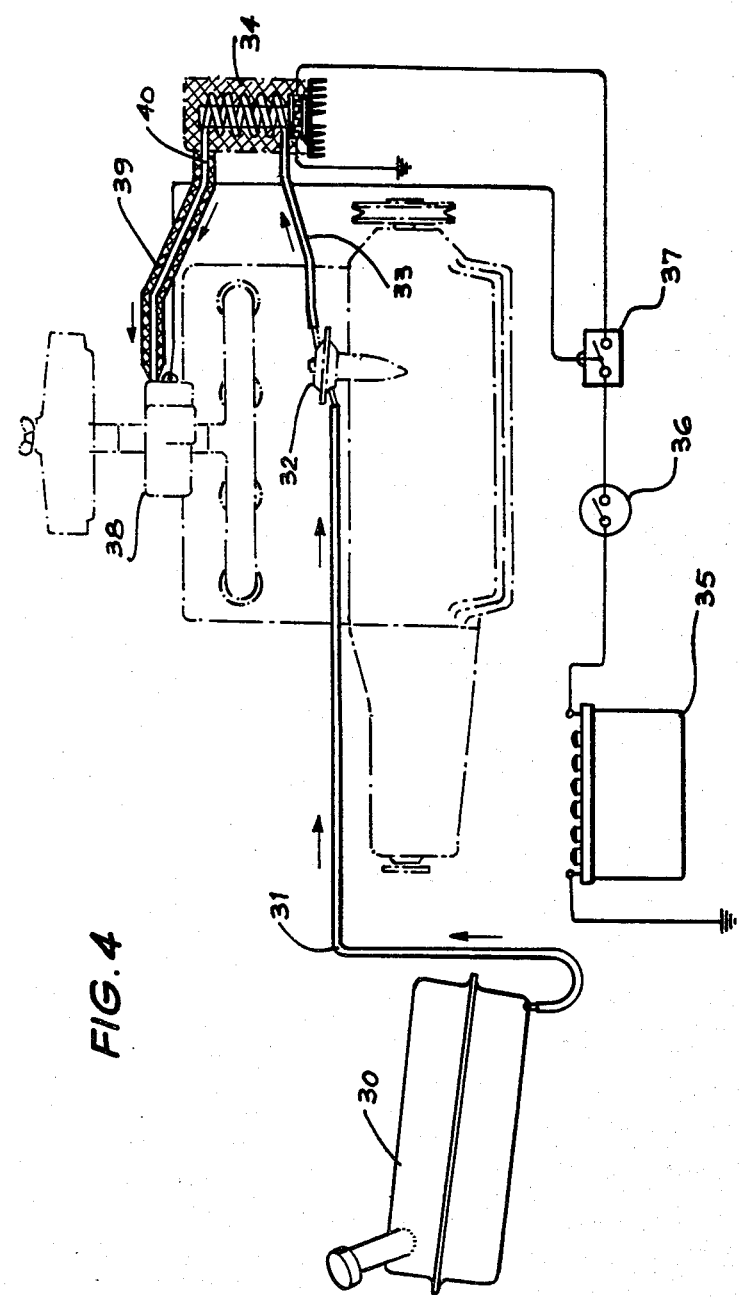

Turning now to FIG. 4, there is shown the fuel supply system of a vehicle which includes a tank 30, supply line 31 and fuel pump 32. The outlet 33 from the fuel pump 32 is fed to a cooler 34 which, in this instance, is similar to the device shown in FIG. 1. Electrical supply to the cooler 34 is provided by the battery 35 through the ignition switch 36 and thermostat 37 which senses the temperature of the fuel at the carburettor 38. Insulation 39 encloses the fuel line 40 from the cooler 34 to the carburettor 38.

It is a feature of the device that by maintaining a particular polarity of electrical supply the device can be made to either cool or heat as desired a flow of liquid or vapour or gases through the heat exchanger 11 within the insulated housing 10.

Alternatively, by supplying a medium of desired temperature through the heat exchanger 11 heat may be dissapated to or claimed from the air which passes over the heat sink 19 for controlling the temperature in an alternative environment. For example the invention can be used in laboratories or computer applications where the provision of a conventional mechanical heat pump would entail problems of noise, vibration, mass and volume.

In the cooling mode, electrical energy is applied in the required polarity to the thermopile 16 which causes a transfer of heat from the heat exchanger 11 to the heat sink 19 which in the concept embodied herein is air cooled. The invention is not limited to air cooled heat sinks 19 only. It is to be understood that other forms of cooling of the heat sink 19 can be employed where the application is suited. For example, the heat sink may be of a design to use ambient water, brines, or second stage cooling with thermopile modules including cascade arrangements, or mechanical refrigeration.

In the heating mode, the electrical supply polarity is reversed and the same operations and functions would apply as those in the cooling mode.

Various modifications may be made in details of design and construction without departing from the scope and ambit of the invention the nature of which is to be determined from the foregoing description.

The claims defining the invention are as follows:

1. A fuel cooling supply system for supplying fuel to a carburetor of an internal combustion engine, the supply system comprising:
   a fuel reservoir;
   a fuel line fluidly coupling the reservoir and the carburetor;
   a fuel pump located along the fuel line; and
   a fuel cooler located along the fuel line, the fuel cooler including:
   a first, cooling heat exchanger fluidly connected along the fuel line, having a flow path between a fuel inlet and a fuel outlet;
   a second, heating heat exchanger; and
   a thermoelectric solid state heat pump thermally coupled to the first heat exchanger to cool said first heat exchanger and thermally coupled to the second heat exchanger to transfer heat to said second heat exchanger so fuel passing from the fuel reservoir to the carburetor is cooled as it passes through the first heat exchanger for enhanced performance; and
   a source of electrical energy connected to the heat pump.

2. The fuel cooling supply system according to claim 1 wherein the first heat exchanger comprises a tube spirally wound around a heat transfer block.

3. The fuel cooling supply system according to claim 1 wherein the heat pump is positioned in heat transfer relationship between the heat transfer block of the first heat exchanger and the second heat exchanger.

4. The fuel cooling supply system according to claim 1 wherein the heat pump is operated by a DC electrical supply which is energized by a thermostat adapted to sense the temperature of the fluid passing through the fuel outlet.

5. The fuel cooling supply system according to claim 1 wherein the second heat exchanger has a plurality of fins.

6. The fuel cooling supply system according to claim 5 wherein air flow past the fins is provided by a fan.

7. The fuel cooling supply system according to claim 2 wherein there is provided a heat pump at each end of the heat transfer block and wherein there is provided a second heat exchanger for each heat pump.

* * * * *